United States Patent [19]
Wong

[11] Patent Number: 6,058,060
[45] Date of Patent: May 2, 2000

[54] MULTI-BIT-PER-CELL AND ANALOG/ MULTI-LEVEL NON-VOLATILE MEMORIES WITH IMPROVED RESOLUTION AND SIGNAL-TO NOISE RATIO

[75] Inventor: Sau C. Wong, Hillsborough, Calif.

[73] Assignee: Invox Technology, Campbell, Calif.

[21] Appl. No.: 09/224,183

[22] Filed: Dec. 31, 1998

[51] Int. Cl.[7] ...................................................... G11C 7/00
[52] U.S. Cl. ............... 365/218; 365/185.03; 365/185.24; 365/185.33
[58] Field of Search ........................... 365/185.22, 185.11, 365/185.03, 185.14, 185.24, 185.3, 188, 218, 185.33

[56] References Cited

U.S. PATENT DOCUMENTS

| | | | |
|---|---|---|---|
| 5,297,095 | 3/1994 | Sato et al. | 365/218 |
| 5,615,153 | 3/1997 | Yiu et al. | 365/185.19 |
| 5,717,632 | 2/1998 | Richart et al. | 365/185.2 |
| 5,796,657 | 8/1998 | Lee et al. | 365/185.11 |
| 5,821,909 | 10/1998 | Yiu et al. | 365/185.14 |

*Primary Examiner*—David Nelms
*Assistant Examiner*—Thong Le
*Attorney, Agent, or Firm*—Skjerven, Morrill, MacPherson, Franklin & Friel, LLP.

[57] ABSTRACT

Applying a negative voltage to unselected word-lines during a read or verify operation reduces leakage current from over-erased memory cells, which allows the memory cells to be over-erased and therefore, to be programmed with lower threshold voltages. The consequence is a non-volatile memory having wider threshold voltage windows, which results in improved resolution and SNR for analog/multi-level and multi-bit-per-cell storage. During programming, the negative voltage is applied to word-lines containing unselected and erased memory cells in the same bit-line as the selected cell to prevent leakage current from over-erased cells, and a ground potential is applied to word-lines containing unselected and previously programmed cells in the selected bit-line to prevent drain disturb. In another embodiment, ground potential is applied to all the unselected word-lines during programming, which requires a programming load line and charge pump able to handle large currents and supply large voltages, respectively, due to the increased combined leakage current on the bit-line.

17 Claims, 3 Drawing Sheets

6,058,060

MULTI-BIT-PER-CELL AND ANALOG/MULTI-LEVEL NON-VOLATILE MEMORIES WITH IMPROVED RESOLUTION AND SIGNAL-TO NOISE RATIO

BACKGROUND

1. Field of the Invention

This invention relates generally to non-volatile semiconductor memories, and more particular, to the operation of such memories to increase the available threshold voltage window size.

2. Description of Related Art

Non-volatile semiconductor memories such as EPROMs, EEPROMs, and Flash memories are well known. In such memories, a threshold voltage Vt of a memory cell indicates a data value stored in the memory cell. When writing (programming) to a selected memory cell in a conventional non-volatile memory array, programming voltages are applied via a word-line (WL) connected to a control gate of the selected cell, via a bit-line (BL) connected to a drain of the selected cell, and a via source-line (SL) coupled to a source of the selected cell. The combination of programming voltages changes the threshold voltage of the selected cell, typically by causing Fowler-Nordheim (F-N) tunneling or channel hot electron (CHE) injection which charges (or discharges) a floating gate in the selected memory cell.

For example, to induce CHE injection in a selected memory cell containing a typical N-channel floating gate transistor, a high voltage Vpp (e.g., approximately 9 to 12 volts or higher) is applied as the control gate voltage Vg to the WL containing the selected cell, a high voltage (e.g., approximately 4.5 to 5.5 volts or higher) is applied as the drain voltage Vd to the BL containing the selected cell, and a low voltage (e.g., near 0 volt) is applied as the source voltage Vs to the SLs. Hot electrons are injected into the floating gate to increase the threshold level with respect to the control gate, thereby programming the selected cell. By adjusting the programming voltage Vpp and/or programming pulse width Twp, the selected cell can be programmed to a desired threshold voltage Vt.

It is desirable to have the ability to program a wide range of threshold voltages for each memory cell in a memory array for wider Vt windows. Wider Vt windows improve the resolution and signal-to-noise ratio (SNR) for a given number of levels of storage and increase the number of levels of storage for a given resolution or Vt increment per level. This translates to improved dynamic range, SNR, reliability, and data integrity for analog/multi-level and multi-bit-per-cell memories.

However, certain practical constraints limit the amount that a Vt window can be widened. For conventional memories, typical threshold voltages have maximum values of approximately 6 volts and minimum values of approximately 3 volts, which represents typical Vt windows of about 3 volts.

During a write to a selected memory cell, the high bit-line and word-line voltages for the selected memory cell can create large voltage differences between the floating gate and drain of unselected memory cells and thereby induce Fowler-Nordheim tunneling that disturbs the threshold voltages of these unselected memory cells by causing electrons to tunnel out or escape from the floating gate to drain. The voltage difference between the drain and floating gate of an unselected memory cell subjects the memory cell to a disturb referred to herein as drain disturb. Since the Fowler-Nordheim tunneling current is exponentially dependent on the electric field in the gate oxide between the bit-line and floating gate, drain disturb will worsen significantly even with a small increase in the electric field.

Consequently, the maximum Vt is limited by program disturb (or drain disturb) of a previously programmed cell. The total accumulative disturb (in mV) is dependent on the number of cells on a bit-line, the write time of a cell, the area and gate oxide thickness between the drain and the floating gate, and the drain voltage applied for programming. For example, drain disturb can be reduced by decreasing bit-line lengths by arranging memory cells in several small arrays rather than one large array. With smaller arrays, fewer memory cells are on the same column so that programming a selected memory cell disturbs fewer unselected memory cells. However, smaller arrays require more source-line, word-line, and bit-line decoders, which increases the cost and size of the memory system. Typical practical considerations limit the maximum Vt to about 6 V.

Minimum threshold voltages are usually limited by leakage current of erased and unselected memory cells coupled to the same bit-line as the selected memory cell. During a read or verify operation, typically 0 volts or ground is applied as the control gate voltage Vg to unselected WLs, i.e., WLs that do not contain the selected cell, and a ramped voltage is applied as the control gate voltage Vg to the selected WL for a read operation and a verify voltage proportional to the desired programmed threshold voltage is applied as the control gate voltage Vg to the selected WL for a verify operation.

During a read operation, the voltage applied to the control gate of the selected cell is ramped until the selected memory cell conducts, i.e., when the voltage at the control gate is at or exceeds the threshold voltage of the cell. The voltage at which the cell conducts represents the voltage stored in the cell. However, erased cells in the same column as the selected cell may contribute sufficient leakage current to the bit-line of the selected cell and cause errors during read or verify operations.

Memory cells in conventional Flash memory arrays are typically simultaneously erased, so that all of the cells in the array connected to a common source line are simultaneously erased. Memory cells are erased by discharging the floating gate, which is typically accomplished through Fowler-Nordheim tunneling by creating a large positive voltage from the source to the gate of the floating gate transistor, while floating the drain. This positive voltage can be as much as 12 volts. Suitable voltages, which are well known, are applied to the WLs, BLs, and SLs of the array to supply voltages to the control gate, drain, and source, respectively, of memory cells in the array. These voltages cause electrons to tunnel from the floating gate to the source via Fowler-Nordheim tunneling, thereby returning the cell to an erased state.

However, erase characteristics of non-volatile memory cells are typically somewhat random and difficult to control. The key controllable parameters include erase voltage, erase time, and the number of cells in a sector which are erased together. In Flash arrays, cells connected to a common source line are erased for the same amount of time. Ideally, each cell in the array requires the same amount of time to erase, i.e., to remove electrons from floating gate and achieve the same lower selected threshold voltage. However, practically, individual memory cells have slightly different characteristics, which require slightly different erase conditions to achieve the same erased threshold voltage Vte. Thus, even with existing erase and Vt monitor algorithms, some faster cells may become over-erased, which can potentially generate excessive positive charge on the floating gate and excessively lower the erased Vt (Vte) of the memory cell. In some situations of over-erasing, the erased threshold voltage becomes negative. As a result, even when 0 volts is applied to the control gates during reading or verify, over-erased cells will conduct slightly and supply a current sufficient to the bit-lines coupled to the over-erased cells, thereby potentially giving an erroneous reading.

The leakage current conducted by over-erased cells in a column during a read or verify operation can degrade or destroy the memory's reliability and endurance. Ideally, the only cell in the column biased for possible conduction is the cell in the selected word line WL. However, if any of the cells in the selected bit-line or column are over-erased and conduct significant current (i.e., sub-threshold conduction current), the combined current flow in the bit-line may exceed the threshold for reading or verify, thereby yielding erroneous results. In some severe situations, a single over-erased cell disables the entire column. In other cases, many of the cells may be slightly over-erased which provides a cumulative leakage current exceeding the desired threshold. Even situations where the leakage current is very minor, the memory cell's characteristics or performance can degrade over time, greatly reducing the reliability and endurance of the device, i.e., the number of cycles that the memory array can be successfully programmed and erased.

As a result, a memory array having memory cells with low programmed threshold voltages can be unreliable, as well as degrade over time, due to the adverse effects of undesirable leakage current from unselected memory cells during read and verify operations. Thus, leakage current during read and verify usually limit the minimum programmed threshold voltages, which limits the extent that the threshold window can be widened. Typical erase schemes allow the erased threshold voltage Vte to be controlled to within a 1 volt variation. In order to achieve a 1 volt margin at the low-end of the minimum programmed threshold voltage Vt,min in order to prevent cell leakage due to sub-threshold conduction current and a 1 volt margin at the high-end of Vt,min in order to ensure accuracy of stored data representing low threshold voltages, a 3-volt Vt is typically the minimum programmed threshold voltage. This results in a 3-volt Vt window, assuming the maximum programmed threshold voltage Vt,max is 6 volts. Table 1 below lists typical programming (write), verify, read, and erase voltages. For example, programming cells with threshold voltages Vt of 3 to 6 volts is obtained by applying programming voltages Vpp of 9 to 12 volts to the control gate of a selected cell and verify voltages Vvfy of 3 to 6 volts (assuming Vvfy=Vt), respectively.

TABLE 1

|  | write | verify | read | erase |
|---|---|---|---|---|
| Vg (selected WL) | ~9 V to 12 V | ~3 V to 6 V | slow ramp | ~0 V |
| Vg (unselected WL) | ~0 V | ~0 V | ~0 V | ~0 V |
| Vd | ~4.5 V to 5.5 V | ~1.5 V to 2 V | ~1.5 V to 2 V | floating |
| Vs | ~0 V | ~0 V | ~0 V | ~10 V to 12 V |

Assuming a typical Vt window size of 3 volts and a typical programming accuracy of better than 10 mV resolution, it is possible to achieve analog/multi-level storage of 256 levels or 8 bit resolution with approximately 12 mV/level and multi-bit-per-cell digital storage of 16 levels or 4 bits/cell with approximately 200 mV/level. Both storage resolutions provide good reliability and data integrity. However, if the Vt window size is limited to only 3 volts, it is difficult to achieve greater than 8 bit resolution for analog/multi-level storage or greater than 4 bits/cell for multi-bit-per-cell storage. Accordingly, it is desired to widen the threshold voltage window without the adverse effects of conventional methods and memories discussed above.

SUMMARY

In accordance with an aspect of the invention, during a read or verify operation of a selected memory cell, a negative potential is applied to the control gates of unselected memory cells that are on the same bit-line or column as the selected memory cell to reduce leakage current on the bit-line. The negative voltage allows analog/multi-level and multi-bit-per-cell memory cells to be over-erased, which allows the memory cells to be programmed at lower threshold voltages. Consequently, a wider range of threshold voltages is possible, resulting in a wider threshold window and providing improved resolution and SNR for storing analog/multi-level and multi-bit-per-cell data.

By applying a suitable negative potential during read and verify operations, memory cells in a memory array that are over-erased will not contribute leakage current to the selected bit-line. Thus, if the negative voltage is less than the erased threshold voltages of the memory cells, even if the erased threshold voltage is negative, these cells will not conduct to supply sub-threshold conduction or leakage current to the selected bit-line, which may otherwise adversely affect the verify and read operation.

A negative voltage at the control gate of erased and previously programmed memory cells increases the electric field between the drain and floating gate, but not to a point where significant Fowler-Nordheim (F-N) tunneling occurs, which could disturb the charge stored at the floating gate. This is because the voltage at the drains of the memory cells is low during read and verify operations.

During programming or writing operations, the negative potential is also applied to control gates of unselected and erased memory cells in the same bit-line as the selected memory cell. As with reading and verify operations, the negative voltage prevents over-erased cells on the same bit-line from contributing large amounts of leakage current to the selected bit-line.

Also during programming, a ground potential or 0 volt is applied to control gates of unselected and previously programmed memory cells on the selected bit-line to prevent drain disturb from degrading data integrity and resolution of previously programmed cells. If the negative potential is also applied to unselected and previously programmed memory cells on the selected bit-line, the electric field between the drain and floating gate is increased sufficiently that electrons tunnel out of the floating gate to the drain at a much faster rate, which reduces the threshold voltage of these previously programmed cells. This drain disturb can be significant due to the high voltages at the drains of the memory cells during a programming operation of a selected memory cell.

According to another aspect of the invention, ground potential or 0 volt is applied to the control gates of all unselected memory cells, regardless of whether they have been erased or previously programmed. By applying a ground potential to control gates of all unselected cells, a programming load line (or the column select transistor and the programming circuit) capable of handling a higher current and a stronger charge pump capable of ensuring a 5.5 V (W/C) at the drain for CHE (channel hot-electron) programming is needed.

The present invention will be more fully understood upon consideration of the detailed description below, taken together with the accompanying drawings.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with the present invention, negative voltages are applied to word-lines (WLs) coupled to unselected memory cells during read and verify operations and to unselected and erased memory cells during programming (write) operations, which allows lower threshold voltages to be programmed for analog/multi-level and multi-bit-per-cell memories.

Figure 1:
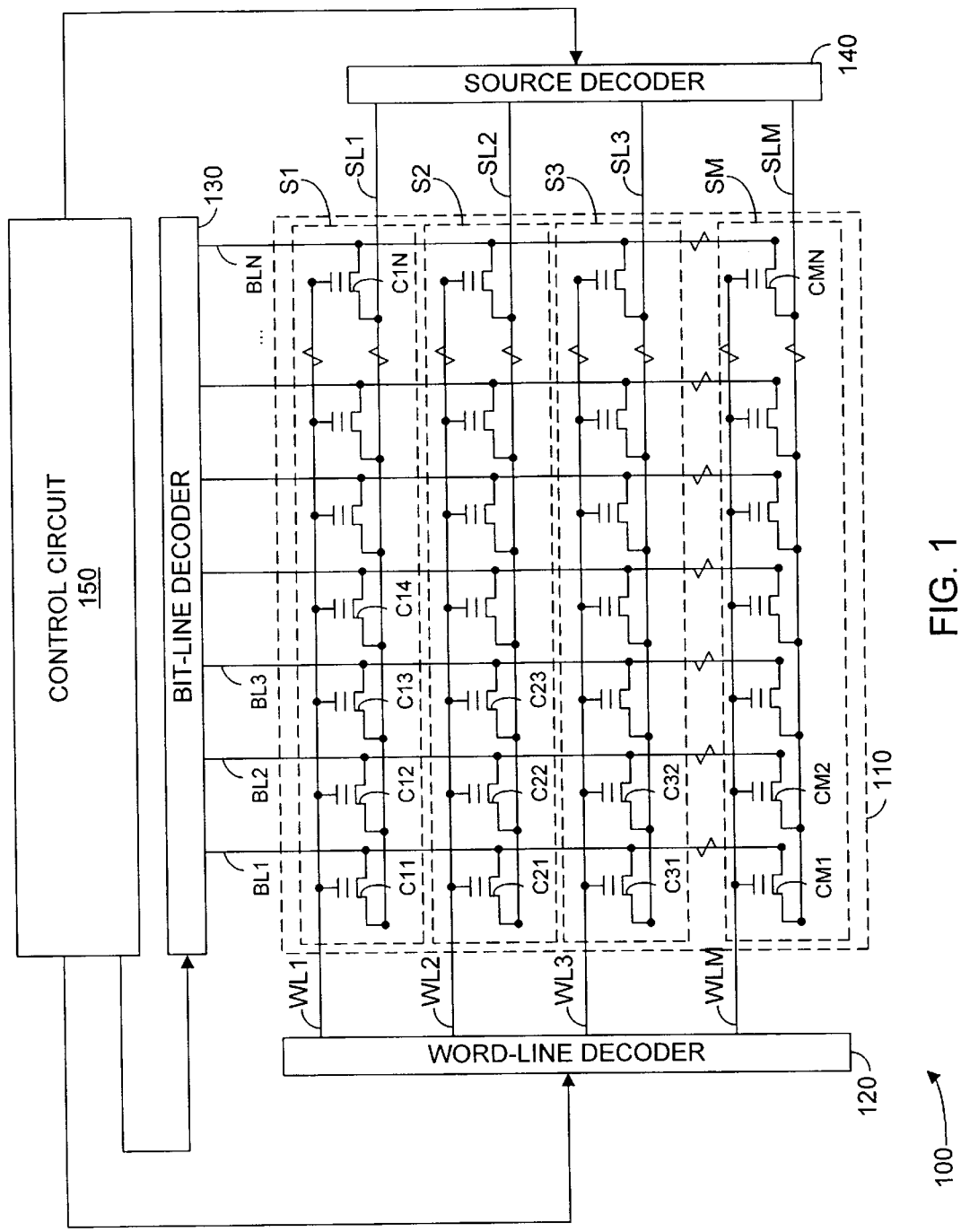
FIG. 1 is diagram of a memory illustrating one embodiment of the present invention.

FIG. 1 is a diagram of a Flash memory 100 for illustration of the present invention. Memory 100 contains an array 110 of non-volatile memory cells C11 to CMN. In FIG. 1, each memory cell C11 to CMN is a floating gate transistor, but alternative memory cell architectures include memory cells containing split gate transistors or a combination of memory transistors and select transistors. Array 110 has M rows or word lines and N columns or bit-lines. Each row of memory cells C11–C1N, C21–C2N, . . . CM1–CMN is associated with the one of word lines WL1 to WLN that couples to the control gates of the memory cells in the row. Each column of memory cells C1–CM1, C12–CM2, . . . C1N–CMN is associated with the one of bit lines BL1 to BLN that couples to the drains of the memory cells in the column. Memory 100 is a flash memory such as a Flash EPROM or Flash EEPROM. Accordingly, memory array 110 is further organized into M independently erasable sectors S1 to SM. Each sector S1 to SM contains a single row of memory cells and is associated with the one of source lines SL1 to SLM that is connected to the sources of memory cells in the row. Note that in other embodiments, sectors can include two rows of memory cells, where one source line couples the sources of two adjacent rows of memory cells. In other embodiments, each sector consists of a number of bit-lines with memory cells on the bit-lines connected to a common source line.

In array 110, each of the memory cells C11 to CMN comprises a floating gate transistor which has a threshold voltage corresponding to an erased state of the memory cell or a value stored in the memory cell. Memory 100 can be an analog or digital memory. For an analog/multi-level memory, each memory cell C11 to CMN has a continuous range of possible threshold voltages that corresponds to a continuous range of stored analog/multi-level values. Alternatively, memory 100 can be a digital multi-bit-per-cell memory where the threshold voltage of the memory cell indicates one of a set of possible discrete digital values.

Connected to array 110 are a row or word-line decoder 120, a column or bit-line decoder 130, and a source decoder 140. In embodiments where the sources of all the memory cells in the array are connected to a common source line, source decoder 140 is not needed. Word-line decoder 120 couples to word lines WL1 to WLM and biases word lines WL1 to WLM as required for read, write, erase, or verify operations. As such, word-line decoder is able to supply negative voltages (for read, write, and erase), positive voltages (for read, write, and verify), and ramped or equivalent voltages (for read). In the exemplary embodiment, word-line decoder 120 includes a transistor tree and word-line drivers. The transistor tree decodes a word-line address signal to identify a selected word-line. The word-line drivers control the voltages on the selected word-line and on unselected word-lines. Word-line decoder 120 selects a word-line voltage according to the desired operation on the selected memory cell. Bit-line decoder 130 couples to bit-lines BL1 to BLN and applies bias voltages to bit-lines BL1 to BLN as required by the desired operation. In the exemplary embodiment, bit-line decoder 130 includes a transistor tree that decodes a bit-line address signal to identify a selected bit-line, drivers that control the voltages on the selected bit-line, and a sense amplifier that bit line decoder 130 connects to the selected bit-line during a read. Source decoder 140 couples to source lines SL1 to SLM and applies appropriate bias voltages to sources of memory cells connected to corresponding source lines SL1 to SLM.

During a read or verify operation, word-line decoder 120 applies a negative voltage (e.g., approximately −3 volts) to the unselected ones of word lines WL1 to WLM, where the unselected word-lines are the ones that do not contain the memory cell selected for the read or verify operation. By applying a negative voltage instead of ground or Vss, as with conventional methods, the memory cells in the array can be over-erased without subjecting the selected bit-line to leakage current. In other words, even if memory cells are over-erased, for example, to an erased threshold voltage of −2 to −1 volts, applying a −3 volt potential to the control gates of these cells will not cause the cells to conduct or leak current onto the selected one of bit-lines BL1 to BLN.

Thus, assuming the same margin requirements discussed above, by applying a −3 volt potential to control gates of unselected cells during a read or verify operation, the minimum threshold voltage Vt,min can be lowered from 3 volts to 0 volts. As a result, the size of the Vt window can be widened from a 3–6 volt window to a 0–6 volt window.

Programming threshold voltages ranging from 0 volts to 6 volts is similar to conventional programming or writing schemes, such as discussed above. For example, bit-line decoder 130 applies a high voltage (e.g., approximately 4.5 to 5.5 volts or higher) to the bit-line containing the selected memory cell, and source decoder 140 applies a low voltage (e.g., near 0 volt) to the source-lines in memory 100. However, in order to program a lower threshold voltage, the range of voltages that word-line decoder 120 applies to word-lines containing the selected memory cell increases to approximately 6 volts to 12 volts, which allows threshold voltages of approximately 0 volts to 6 volts, respectively, to be programmed or stored in the selected cell. Similarly, during a verify operation, the range of verify voltages Vvfy increases to 0 to 6 volts, instead of 3 to 6 volts. Any suitable program and verify operation can be utilized, some of which are described in commonly-owned U.S. Pat. Nos. 5,687,115, entitled "Write Circuits For Analog Memory" to Wong et al. and 5,818,757, entitled "Analog and Multi-Level Memory With Reduced Program Disturb" to So et al., and in commonly-owned U.S. patent application Ser. Nos. 09/128, 225, entitled "High Data Rate Write Processes for Non- Volatile Flash Memories, filed Aug. 3, 1998 and UNKNOWN, entitled "Dynamic Write Process for High Bandwidth Multiple-Bit-Per-Cell and Analog Non-Volatile Memories, filed concurrently and bearing attorney Docket Number M-7183, all of which are incorporated by reference in their entirety.

During programming of the selected cell, it is undesirable to apply the negative potential (−3 volts) to all unselected word-lines. For example, if −3 volts is applied to the control gate of an unselected but previously programmed memory cell in the same column as the selected memory cell, the floating gate of the unselected cell will be coupled to a more negative voltage (e.g., from −3 volts to −4.8 volts assuming the control gate-to-floating gate coupling ratio is 0.6), which results in a higher voltage across the thin oxide (typically less than 100 Å thick) between the drain and floating gate. Because a high voltage (4.5 to 5.5 volts and higher) is applied to drains of memory cells on the same bit-line as the selected cell, the electric field between the floating gate and drains of these unselected and previously programmed cells will increase. Thus, electrons will tunnel out from the floating gate to the drain at a much faster rate, thereby reducing the threshold voltage of these previously programmed cells and resulting in a decrease in data integrity and resolution. This drain disturb from the F-N tunneling current can be significant since the tunneling current is exponentially dependent on the electric field across the oxide.

Therefore, during programming of a selected memory cell, word-line decoder 120 applies approximately 0 volts or Vss to word-lines containing unselected and previously programmed memory cells in the same bit-line as the selected memory cell. Consequently, unselected cells on the same bit-line that are programmed with slightly higher threshold voltages than 0 volts (e.g., greater than 1 volt) will not contribute leakage current to the selected bit-line. But, unselected cells on the same bit-line that are programmed with low threshold voltages (e.g., around 0 volts) may contribute a very small leakage or sub-threshold conduction current. However, during programming, the load-line (or the column pass circuit (not shown)) typically is capable of supplying over a few hundred $\mu$As. Furthermore, most or all of the cells on the same bit-line are not likely to all have been programmed to the lowest threshold level due to inherent randomness of data storage. Therefore, applying 0 volts to word-lines containing unselected and programmed memory cells in the same bit-line as the selected memory cell should not adversely affect the programming operation from effects of any combined leakage current.

However, the negative potential (−3 volts) can and should be applied to word-lines containing unselected and erased memory cells in the same column as the selected memory cell. Because erased memory cells can have very low threshold voltages (e.g., −2 to −1 volts), a potential smaller than these erased threshold voltages at the unselected word-lines is needed to prevent the erased memory cells from contributing leakage current to the selected bit-line. Thus, if memory cells are over-erased to −2 to −1 volts, a negative potential of −3 volts applied to the control gates of the over-erased cells will prevent leakage current.

Similarly, during read and verify operations, word-line decoder 120 can apply a negative potential (−3 volts in the discussion) to all word-lines containing an unselected memory cell that is in the same bit-line as the selected memory cell in order to prevent leakage current from adversely affecting the operation of memory 100. Because bit-line decoder 130 applies a lower voltage (e.g., approximately 1.5 to 2 volts) to the drains of the memory cells during a read or verify operation, application of the negative potential to both erased and previously programmed unselected cells does not increase the electric field between the drain and floating gate to a point where any F-N tunneling current will be minimum. Other aspects of read and verify operations are known, such as applying a ramped voltage to the control gate of the memory cell being read. For an analog/multi-level memory, the voltage is slowly ramped from low to high or high to low voltages, such as described in commonly-owned U.S. Pat. Nos. 5,687,115, entitled "Write Circuits For Analog Memory", which is incorporated above and 5,751,635, entitled "Read Circuits For Analog Memory Cells" to Wong et al., which is incorporated by reference in its entirety. For a multi-bit-per-cell memory, the read voltage is increased or decreased in stepped increments using a counter scheme, such as described in commonly-owned U.S. patent application Ser. No. 09/053,716, entitled "High Resolution Multi-Bit-Per-Cell Memory", which is incorporated by reference in its entirety.

In order to selectively apply negative voltages to rows or word-lines of a memory array, a row decoder and driver capable of supplying negative voltages is needed. In conventional Flash memory cell arrays, only non-negative voltages are applied to the various lines. A Flash memory cell is erased by discharging the floating gate, which is typically accomplished through Fowler-Nordheim tunneling by applying a high positive voltage (e.g., approximately 10 to 12 volts) to the source, a low voltage (i.e., approximately 0 volts) to the control gate, and floating the drain (referred to herein as a ground-gated erase scheme). As a result, Fowler-Nordheim tunneling current flows through the thin tunnel oxide film from the floating gate to the source region, and electrons are removed from the floating gate to complete the erase operation (i.e., the threshold level becomes the "reset" condition before programming).

However, such erasing schemes have certain disadvantages. Since a high voltage is applied to the source during erasing, a gate-modulated junction breakdown voltage at the side of the source region overlapped by the floating gate must be increased, which makes it necessary to make the source region deeper than the drain region and/or to gradually decrease the impurity concentration of the source region (graded junction). A deeper source region limits the ability for device scaling, which requires a longer channel length.

Furthermore, applying a high voltage to the source and grounding the control gate creates a very high reverse voltage between the source and the substrate, which causes gate-modulated junction breakdown, which in turn, causes current flow from the source to substrate, sometimes referred to as band-to-band tunneling current $I_{BB}$. The junction breakdown current flowing to the substrate can cause generation of hot carriers near the source. Some of the hot carriers may become trapped in the tunnel oxide film, i.e., "hot carrier trapping," thereby reducing the reliability and endurance characteristics of the memory cell.

In addition, for Flash memory devices, the high erase voltage is applied in parallel to the entire array or to large sectors of the array. Thus, the internal high voltage power supply used during the erasing procedure must be capable of handling the current required to erase a large number of cells in parallel.

High erase voltages also require large current requirements for the charge-pump to generate the high voltages, especially when $I_{BB}$ and the number of cells to be simultaneously erased is large (e.g., chip erase is the worst-case scenario). For example, if $I_{BB}$ is assumed to be 10 nA per cell, and all the cells in a 1 meg array needs to be erased simultaneously, the charge pump current requirement becomes very large, i.e., estimated at about 10 mA. High voltage charge pumps that can supply such a high current are difficult to implement in the memory circuitry due to the large silicon overhead required, large power consumption, and high noise generation.

The above deficiencies with the ground-gated erase scheme can be reduced by applying a negative voltage to the control gate during erasing (referred to herein as a negative-gate erase scheme). For example, approximately −8 to −10 volts is applied to the control gate, approximately 3 to 5 volts is applied to the source, and the drain is grounded or left floating. The result is an electric field between the floating gate and source that is equivalent to the conventional ground-gated erase scheme. Negative-gate erase schemes allow lower voltages to be applied to the source regions, which reduces the junction breakdown voltage at the source side and reduces or eliminates hot carrier generation and trapping. Therefore, it is not necessary that the depth of the source region is made deeper than that of the drain region or that the impurity concentration of the source region be reduced gradually. Accordingly, it is possible to reduce the gate length of the cell using the negative-gate bias during erase.

Thus, memory systems utilizing negative-gate erase schemes, which have decoders and drivers capable of supplying negative voltages, can be easily modified to allow negative voltages to be applied to word-lines according to the present invention, i.e., during read, verify, erase, and program operations.

Figure 2:
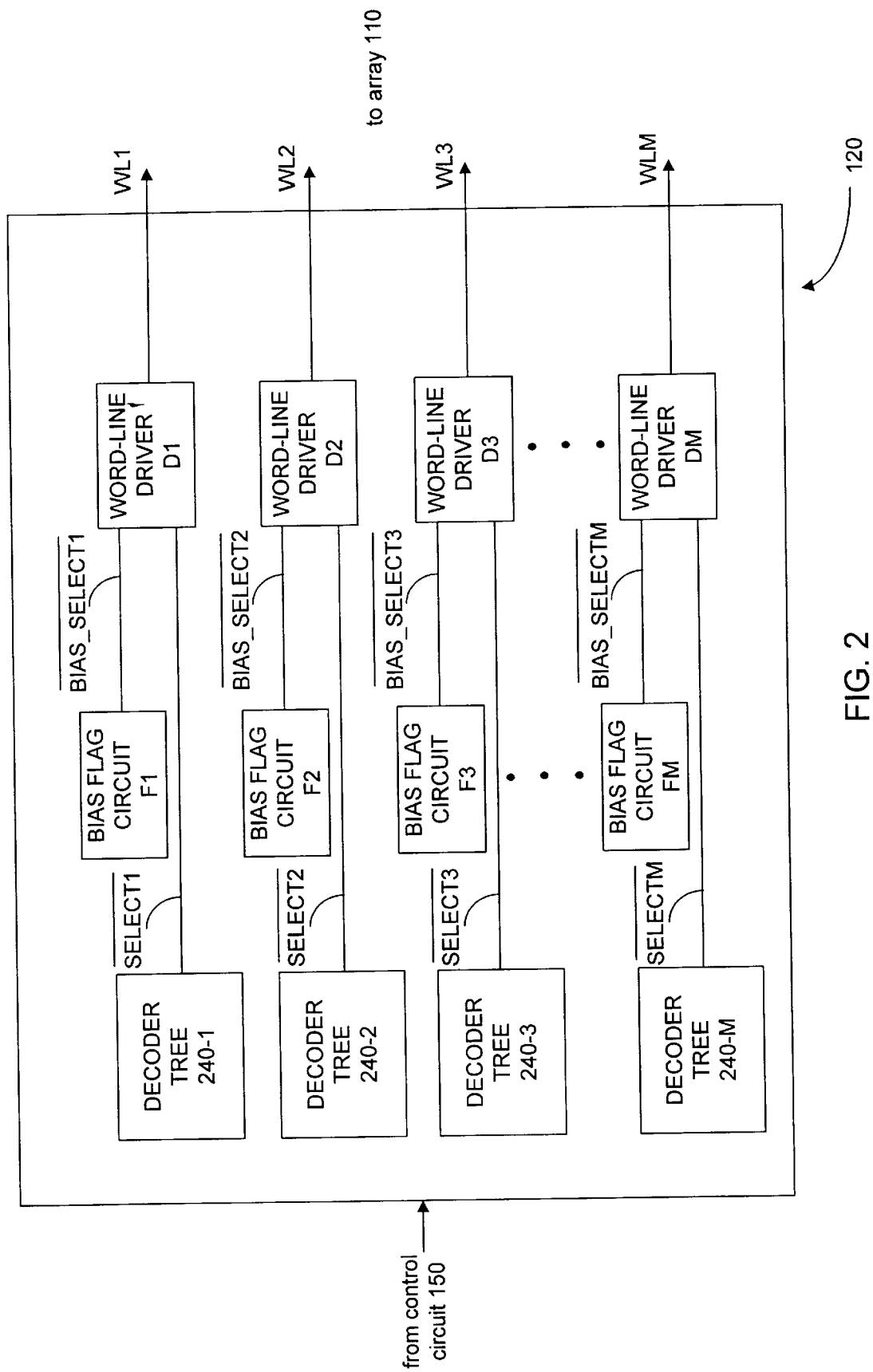
FIG. 2 is a diagram of a word-line decoder according to one embodiment of the present invention.

FIG. 2 shows one embodiment of word-line decoder 120 which can selectively apply negative voltages to word-lines WL0 to WLM of memory 100 of FIG. 1. Word line decoder 120 includes decoder trees 240-1 to 240-M, bias flag circuits F1 to FM, and word-line drivers D1 to DM. Word-line drivers D1 to DM apply a negative potential $V_N$ to all unselected word-lines for read or verify operations and a negative erase voltage to all word lines selected for erase. For programming operations, word-line drivers D1 to DM apply ground, negative potential $V_N$, or a programming voltage $V_{PP}$ to individual word-lines as described above.

Bias flag circuits F1 to FM indicate which rows contain previously programmed memory cells and which rows do not. After each erase of memory array 110, all of bias flag circuits F1 to FM indicate none of rows are programmed. When programming data to a selected memory cell, one of decoder trees 240-1 to 240-M asserts the one of associated select signals $\overline{\text{SELECT1}}$ to $\overline{\text{SELECTM}}$ which corresponds to the selected row or word-line, and the one of drivers D1 to DM to which the select signal is asserted applies a programming voltage to the selected word-line. After a word-line is selected, the bias flag circuit associated with the selected word-line indicates that the selected cell has been programmed so that the corresponding word-line driver can apply a ground potential to the word-line if the word-line is unselected during a subsequent write. In one embodiment, each bias flag circuit F1 to FM acts as a volatile memory cell or latch which is set when the associated word-line WL1 to WLM is selected during a write. Flag circuits F1 to FM can be cleared when array 110 is erased or alternatively before each memory operation including reading from and writing to memory array 110.

In addition to programming voltage on the selected word-line, drivers D1 to DM also apply a negative potential $V_N$ to some unselected word-lines and a ground potential $V_{SS}$ to other unselected word-lines. Whether particular ones of word-lines WL1 to WLM are grounded or at $V_N$ when unselected depends on signal $\overline{\text{BIAS-SELECT1}}$ to $\overline{\text{BIAS-SELECTM}}$ from the associated bias flag circuits F1 to FM. If a bias flag circuit indicates that an unselected row contains stored data, the associated word-line driver applies ground potential $V_{SS}$ to the unselected word-line. If the flag circuit indicates that an unselected row contains no data, i.e., erased, the associated word-line applies negative potential $V_N$ to the unselected word-line.

In one embodiment, memory 100 stores a series of samples representing a continuous signal such as an audio signal. Each sample is an analog value or a multi-level value which is written into one of memory cells C11 to CMN. When recording the continuous signal (i.e. writing the samples), an address signal generator (not shown) selects where each sample is written and generates consecutive address signals so that a row of memory cells is filled with data values before writing samples to the next row begins. For example, samples can be written sequentially beginning with memory cell C11 which is in the first row and first column. When the first value is written, a row address signal generator (not shown) asserts a row address which causes decoder tree 240 to assert signal $\overline{\text{SELECT1}}$ and set bias flag circuit F1 to indicate row C11 . . . C1N contains data.

Programming voltages are applied to the first (i.e. selected) word-line WL1; and while a data value is written to memory cell C11, negative potential $V_N$ is applied to all of the unselected word-lines WL2 to WLM because all of bias flag circuits F2 to FM were cleared following an erase. The row address signal remains constant and the same select signal $\overline{\text{SELECT1}}$ remains asserted while a column address signal generator (not shown) sequentially increments the column address signal for writing data values in row C11 . . . C1N. The gate programming voltage is applied to first word-line WL1 while writing to the first row. After a data value is written to the last memory cell C1N in the first row, the row address signal generator increments the row address signal, and writing continues with memory cells in the second row C21 . . . C2N. When programming the second row, word-line driver D2 asserts the programming voltage to the selected second word-line WL2. Negative potential $V_N$ is applied to unselected word-lines WL3 to WLM when programming memory cells in row C21 . . . C2N, but driver D1 for the now unselected first row C1 . . . C1N applies ground potential $V_{SS}$ to word-line WL1 because associated bias flag circuit F1 asserts a signal indicating the first row contains data, i.e., previously programmed. After the last memory cell C2N in row C21 . . . C2N is programmed, two unselected word-lines WL1 and WL2 are at ground potential during programming. Programming continues in this fashion until the last row CM1 . . . CMN is programmed. Application of negative voltages to desired word-lines for read and verify operations can be implemented similarly, with the exception that negative voltages are applied to all unselected word-lines, regardless of whether memory cells in the unselected word-lines have been erased or programmed, as discussed above.

Circuitry which implements the programming process described for memory 200 of FIG. 2, can be implemented in a variety of ways, which are known to those in the art. For example, bias flag circuits F1 to FM can be level triggered latches or edge triggered registers which are set when an associated word-line is selected. Bias flag circuits F1 to FM can alternatively be replaced with a shift register that shifts each time the row address signal changes. Alternatively, a non-volatile memory cell from each row in array 110 can be programmed to indicate whether the remainder of memory cells in a row are in an erased state. In yet another embodiment, bias flag circuits F1 to FM do not have memory capabilities but instead use the row address signal to directly determine whether rows 1 to M contain data. Rows having row addresses lower than a row selected for a write contain data if memory cells are sequentially programmed.

Figure 3:
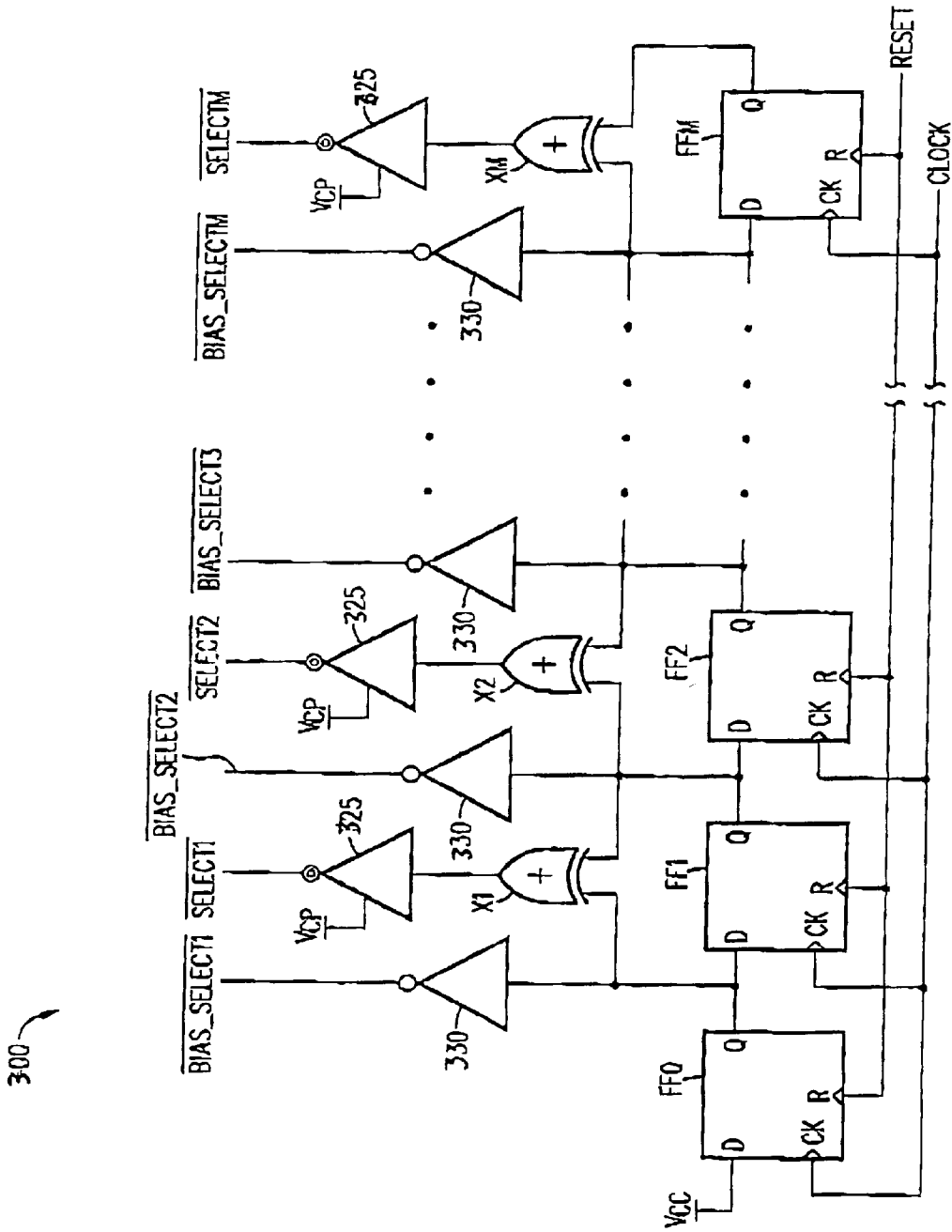
FIG. 3 is a diagram of a word-line selection circuit according to one embodiment of the present invention.

If memory 100 of FIG. 1 writes and reads data values sequentially, decoder trees 240-1 to 240-M and bias-flag circuits F1 to FM in word-line decoder 120 of FIG. 2 can be replaced by a word-line selector circuit shown in FIG. 3. Word-line selector circuit 300 includes a set of flip-flops FF0 to FFM coupled in a series with a data output terminal Q of each preceding flip-flop FFI coupled to a data input D of a following flip-flop FF(I+1). The data input terminal of flip-flop FF0 is coupled to supply voltage Vcc. Flip-flops FF0 to FFM are all reset before each operation such as a write or a read of memory array 110. XOR gates X1 to XM have input terminals coupled to data output terminals of two consecutive flip-flops and generate signals which high voltage inverters 325 convert to signals $\overline{\text{SELECT1}}$ to $\overline{\text{SELECTM}}$. Initially, all data output signals from flip-flops FF0 to FFM are low, and inverters 325 set row select signals $\overline{\text{SELECT1}}$ to $\overline{\text{SELECTM}}$ to voltage Vcp to indicate no rows are selected.

When a write or read begins, a first pulse of a signal CLOCK causes the output of flip-flop FF0 to go high, the output signal from XOR gate X1 to go high, and signal $\overline{\text{SELECT1}}$ to go low selecting the first row. Clock signal CLOCK next clocks flip-flops FF0 to FFM when writing or reading of the first row is complete. At that point, the data output signals from flip-flops FF0 and FF1 are high causing output signal from XOR gate Xi to fall and signal $\overline{\text{SELECT1}}$ to go high. The output from XOR gate X2 goes high, and signal $\overline{\text{SELECT2}}$ falls to select the second row for reading or writing. Signal CLOCK clocks flip-flops FF0 to FFM in this same fashion after each row of memory array 110 is written or read, and each time flip-flops FF0 to FFM are clocked the next one of signals $\overline{\text{SELECT1}}$ to $\overline{\text{SELECTM}}$ selects a corresponding row in array 110. Accordingly, the rows of array 110 are sequentially selected.

Inverters 330 generate signals BIAS-SELECT1 to BIAS-SELECTM from the data output signals of flip-flops FF0 to FF(M−1). Initially, all of the data output signals of flip-flops FF0 to FFM are low causing all of signals $\overline{\text{BIAS-SELECT1}}$ to $\overline{\text{BIAS-SELECTM}}$ to be high. Each time signal CLOCK clocks flip-flops FF0 to FFM another of the data output signals goes high and unselected rows are sequentially selected for application of word-line bias voltage Vbias. Inverters 330 are disabled during a read so that none of the unselected rows have a bias voltage applied during a read.

Table 2 below lists operating conditions for one embodiment of the present invention.

TABLE 2

|  | write | verify | read | erase |
|---|---|---|---|---|
| Vg (selected WL) | ~6 V to 12 V | ~0 V to 6 V | slow ramp | ~−8 V to −10 V |
| Vg (unselected WL and previously programmed) | ~0 V | ~−3 V | ~−3 V | ~−8 V to −10 V |

TABLE 2-continued

|  | write | verify | read | erase |
|---|---|---|---|---|
| Vg (unselected WL and erased) | ~−3 V | ~−3 V | ~−3 V | ~−8 V to −10 V |
| Vd | ~4.5 V to 5.5 V | ~1.5 V to 2 V | ~1.5 V to 2 V | floating or ~0 V |
| Vs | ~0 V | ~0 V | ~0 V | ~3 V to 5 V |

Thus, the present invention allows a wider range of threshold voltages to be programmed. In the above description, the Vt window is increased from 3 volts to 6 volts, i.e., Vt,min can be lowered from 3 volts to 0 volts with the same Vt,max of 6 volts. Wider Vt windows improve the resolution and signal-to-noise ratio (SNR) for a given number of levels of storage and increase the number of levels of storage for a given resolution or Vt increment per level. This translates to improved dynamic ranges or SNRs for analog/multi-level memories, and either increased data integrity/reliability or more bits per cell for multi-bit-per-cell memories. For example, Table 3 below shows the improved storage resolution for the biasing scheme of the present invention as compared to that for a conventional biasing scheme.

TABLE 3

| Type of storage | Conventional biasing | Negative WL biasing |
|---|---|---|
| Analog/multi-level (@ 12 mV/level) | ~8 bit equivalent (or 256 levels) | ~9 bit equivalent (or ~512 levels) |
| Analog/multi-level (@ 256 levels or 8 levels) | ~12 mV/level | ~20 mV/level |
| Multi-bit-per-cell (@ 187 mV/level) | ~4 bits per cell equivalent (or 16 levels) | ~5 bits per cell equivalent (or 32 levels) |
| Multi-bit-per-cell (@ 4 bits per cell or 16 levels) | ~187 mV/level | ~375 mV/level |

In another embodiment of the present invention, 0 volts or Vss is applied to all word-lines containing unselected memory cells in the same bit-line as the selected memory cell, regardless of whether the unselected cell has been erased or previously programmed. The rest of the operating conditions remain the same as with the previous embodiment. In this embodiment, the programming load line (or the column select transistor and the programming circuit) must be able to handle a higher current, which consists of the programming current of selected cell plus the combined leakage current of all the remaining unprogrammed cells sharing the same bit-line as the selected memory cell. This technique requires a much stronger charge pump to ensure a 5.5 V (W/C) needed at the drain for CHE (channel hot-electron) programming. However, the word-line decoder circuitry is simpler since the word-lines are only applied with two different voltages during programming (e.g., Vpp and 0 volts), as opposed to three voltages (e.g., Vpp, 0 volts, and −3 volts).

Although the invention has been described with reference to particular embodiments, the description is only an example of the invention's application and should not be taken as a limitation. For example, the present invention can be applied to any suitable type of memory array configuration and word-line decoding and driving circuits capable of selective negative voltage application. Various adaptations and combinations of features of the embodiments disclosed are within the scope of the invention as defined by the following claims.

I claim:

1. A method for operating a selected memory cell in an array of memory cells, comprising:

during a read operation, applying a first negative voltage to a first word-line in the array, wherein the first word-line is not coupled to the selected memory cell; and applying a read voltage to a second word-line in the array, wherein the second word-line is coupled to the selected memory cell; and during a programming operation, applying the first negative voltage to a third word-line, wherein the third word-line is not coupled to the memory cell selected for programming and is coupled to memory cells in an erased state;

applying a non-negative voltage to a fourth word-line, wherein the fourth word-line is not coupled to the memory cell selected for programming and is coupled to memory cells in a programmed state; and applying a programming voltage to a fifth word-line, wherein the fifth word-line is coupled to the memory cell selected for programming.

2. The method of claim 1, wherein the non-negative voltage is approximately 0 volt.

3. The method of claim 1, wherein the first negative voltage is approximately −3 volts.

4. A method for operating a selected memory cell in an array of memory cells, comprising:

during a read operation, applying a first negative voltage to a first word-line in the array, wherein the first word-line is not coupled to the selected memory cell; and applying a read voltage to a second word-line in the array, wherein the second word-line is coupled to the selected memory cell; and during an erase operation, applying a second negative voltage to a third word-line, wherein the third word-line is coupled to memory cells to be erased, wherein the erasing operation over-erases some of the memory cells coupled to the third word-line.

5. The method of claim 4, wherein the over-erased memory cells have threshold voltages less than approximately −1 volt.

6. The method of claim 5, wherein the over-erased memory cells have threshold voltages between approximately −2 volts and −1 volt.

7. A method for operating a selected memory cell in an array of memory cells, comprising:

during a read operation, applying a first negative voltage to a first word-line in the array, wherein the first word-line is not coupled to the selected memory cell; and applying a read voltage to a second word-line in the array, wherein the second word-line is coupled to the selected memory cell; and during a verify operation, applying a third negative voltage to a second word-line in the array, wherein the second word-line is not coupled to the selected memory cell; and applying a verify voltage to a fourth word-line in the array, wherein the fourth word-line is coupled to the selected memory cell.

8. The method of claim 7, wherein the first and third negative voltages are approximately equal.

9. A method for programming a selected memory cell in an array of memory cells, comprising:

applying a first negative voltage to a first word-line, wherein the first word-line is not coupled to the memory cell selected for programming and is coupled to memory cells in erased states;

applying a non-negative voltage to a second word-line, wherein the second word-line is not coupled to the memory cell selected for programming and is coupled to memory cells in programmed states; and applying a programming voltage to a third word-line, wherein the third word-line is coupled to the memory cell selected for programming.

10. The method of claim 9, wherein the programming voltage is between approximately 6 volts and 12 volts to program threshold voltages between approximately 0 volt and 6 volts, respectively.

11. The method of claim 9, further comprising:

during a verify operation, applying a second negative voltage to a fourth word-line in the array, wherein the fourth word-line is not coupled to the selected memory cell; and applying a verify voltage to a fifth word-line in the array, wherein the fifth word-line is coupled to the selected memory cell.

12. The method of claim 9, wherein the non-negative voltage is approximately 0 volt.

13. The method of claim 9, wherein the first negative voltage is approximately −3 volts.

14. A method for operating a selected memory cell in an array of memory cells, comprising:

during a read operation, applying a first negative voltage to a first word-line in the array, wherein the first word-line is not coupled to the memory cell selected for reading; and applying a read voltage to a second word-line in the array, wherein the second word-line is coupled to the memory cell selected for reading; and during a programming operation, applying approximately 0 volt to a third word-line, wherein the third word-line is not coupled to the memory cell selected for programming; and applying a programming voltage to a fourth word-line, wherein the fourth word-line is coupled to the memory cell selected for programming, and wherein the programming voltage ranges from approximately 6 volts to 12 volts corresponding to threshold voltages ranging from approximately 0 volt to 6 volts, respectively.

15. The method of claim 14, further comprising:

during a verify operation, applying a second negative voltage to a fifth word-line in the array, wherein the fifth word-line is not coupled to the memory cell selected for verifying; and applying a verify voltage to a sixth word-line in the array, wherein the sixth word-line is coupled to the memory cell selected for verifying.

16. The method of claim 14, wherein the programming voltage ranges from approximately 6 volts to 12 volts corresponding to the verify voltage ranging from approximately 0 volt to 6 volts, respectively.

17. A non-volatile memory, comprising:
an array of memory cells, the array including a set of word-lines, wherein each word-line is coupled to control gates of memory cells in a row associated with the word-line; and
a word-line decoder coupled to the array, wherein the word-line decoder applies to a first word-line in the array, wherein the first word-line is not coupled to the selected memory cell, a negative voltage during a read or verify operation of the selected memory cell, or approximately 0 volt during a programming operation of the selected cell.

* * * * *